(12) United States Patent
Hirose

(10) Patent No.: US 6,452,861 B1
(45) Date of Patent: Sep. 17, 2002

(54) SEMICONDUCTOR MEMORY DEVICE ALLOWING SIMULTANEOUS INPUTTING OF N DATA SIGNALS

(75) Inventor: Masakazu Hirose, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/981,811

(22) Filed: Oct. 19, 2001

(30) Foreign Application Priority Data

Apr. 24, 2001 (JP) ........................................ 2001-125644

(51) Int. Cl.$^7$ ................................................. G11C 7/00

(52) U.S. Cl. ............................. 365/230.06; 365/189.01; 365/189.07

(58) Field of Search ....................... 365/230.06, 189.01, 365/189.07, 194, 189.11

(56) References Cited

U.S. PATENT DOCUMENTS

| | | | | |
|---|---|---|---|---|
| 5,604,511 A | * | 2/1997 | Ohi | ............................. 345/98 |
| 6,320,787 B1 | * | 11/2001 | Ikeda | ..................... 365/185.04 |
| 6,330,186 B2 | * | 12/2001 | Tanaka | .................. 365/185.11 |

FOREIGN PATENT DOCUMENTS

| | | |
|---|---|---|
| JP | 5-73346 | 3/1993 |
| JP | 11-96798 | 4/1999 |

* cited by examiner

*Primary Examiner*—Son T. Dinh
(74) *Attorney, Agent, or Firm*—McDermott, Will & Emery

(57) ABSTRACT

The SDRAM is provided with a decoder for generating four inversion instruction signals corresponding to four data signals according to a column address signal not used for a column select and a word configuration activating signal, and a data inverting circuit for outputting each data signal inverted or uninverted according to four inversion instruction signals. Thus, four data signals of the "H" level can be input so as to write in a desired test pattern with ease.

5 Claims, 14 Drawing Sheets

| CELL OF INTEREST | DQ REQUIRING INVERSION | CA9 | CA10 | CA11 | CA12 |
|---|---|---|---|---|---|
| DQ0 (Y=n) | DQ3 (Y=n-1) | 0 | 0 | 0 | 1 |
| | DQ0,1 (Y=n) | 1 | 0 | 0 | 1 |
| DQ1 (Y=n) | DQ0-2 (Y=n) | 0 | 1 | 0 | 1 |
| DQ2 (Y=n) | DQ1-3 (Y=n) | 1 | 1 | 0 | 1 |
| DQ3 (Y=n) | DQ2,3 (Y=n) | 0 | 0 | 1 | 1 |
| | DQ0 (Y=n+1) | 1 | 0 | 1 | 1 |

| CELL OF INTEREST | DQ REQUIRING INVERSION | CA11 | CA12 |
|---|---|---|---|
| DQ0 (Y=n,CA9=0) | DQ2 (Y=n-1,CA9=1) | 0 | 1 |
| | DQ0 (Y=n,CA9=0) | 1 | 0 |
| | DQ0 (Y=n,CA9=1) | 1 | 0 |
| DQ0 (Y=n,CA9=1) | DQ0,2 (Y=n,CA9=0) | 1 | 1 |
| | DQ0 (Y=n,CA9=1) | 1 | 0 |
| DQ2 (Y=n,CA9=0) | DQ0,2 (Y=n,CA9=1) | 1 | 1 |
| | DQ2 (Y=n,CA9=0) | 0 | 1 |
| DQ2 (Y=n,CA9=1) | DQ2 (Y=n,CA9=0) | 0 | 1 |
| | DQ2 (Y=n,CA9=1) | 0 | 1 |
| | DQ0 (Y=n+1,CA9=0) | 1 | 0 |

WRITE CYCLE
FIG. 12A CLK 
FIG. 12B COMMAND 
FIG. 12C CA9-12 
FIG. 12D D0-2 
FIG. 12E /D0-2 
TIME t →

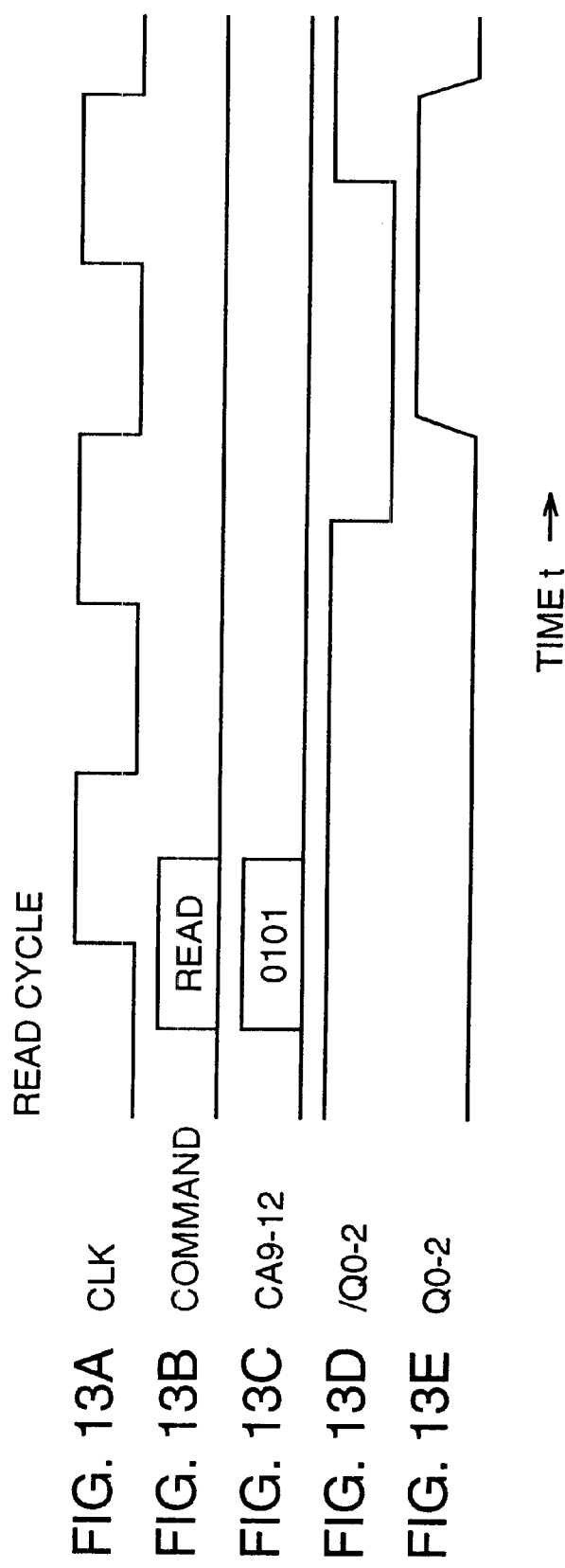

SEMICONDUCTOR MEMORY DEVICE ALLOWING SIMULTANEOUS INPUTTING OF N DATA SIGNALS

BACKGROUND OF THE INVENTION

1. Field of the Invention

The present invention relates to a semiconductor memo device, and more specifically, to a semiconductor memory device allowing data signals externally supplied to be written into N memory cells that a selected.

2. Description of the Background Art

Conventionally, a test for detecting a defective memory cell is conducted for a semiconductor memory such as a synchronous dynamic random access memory (hereinafter referred to as SDRAM) before shipping.

FIG. 17 is a block diagram representing the relations among a column address signal Y, data signals DQ0 to DQ3, and a bit line pair BL, /BL in a x16 configuration of such an SDRAM. In FIG. 17, a memory cell MC is arranged in each intersection portion of bit line pair BL, /BL and a word line WL, and a sense amplifier 50 is provided to each bit line pair BL, /BL. A plurality of bit line pairs BL, /BL are divided into groups of four bit line pairs in advance. Two groups are shown in FIG. 17. For the two groups, unique column address signals Y=n−1, Y=n are respectively assigned. The first to fourth bit line pairs BL, /BL of each group are respectively used for inputting/outputting of data signals DQ0 to DQ3.

In such an arrangement, a faulty read of a data signal from a memory cell MC is most likely to occur when a data signal of a memory cell MC of interest which is the target of testing (cell MC of interest is shown by a solid-filled black circle in FIG. 17) is read in a situation where a data signal of the logic low or "L" level is written in the cell MC of interest, data signals of the "L" level are written in memory cells MC on either side of that memory cell MC of interest in the same row, and data signals of the logic high or "H" level are written in other memory cells MC in the same row.

Since the "L" level is written in cell MC of interest, when word line WL attains the select level while sense amplifier 50 is rendered active, bit line BL of a column of cell MC of interest attains the "L" level, while bit line /BL attains the "H" level. Since the "L" level is written in memory cells MC on either side of cell MC of interest, bit lines BL of the corresponding columns attain the "L" level, while bit lines /BL attain the "H" level. Consequently, bit line BL of the column of cell MC of interest and bit line /BL of the column on one side thereof would attain opposite levels, while bit line /BL of the column of cell MC of interest and bit line BL of the column on the other side thereof would attain opposite levels, so that the coupling noise becomes great.

In addition, since the "H" level is written in other memory cells MC, when word line WL attains the select level and sense amplifier 50 is rendered active, a ground noise is generated due to the reading of the data signal of the "H" level. Thus, faulty read of the data signal having the "L" level from cell MC of interest is likely to occur.

Thus, the sense operation margin becomes the smallest when the test pattern is employed in which the "L" level is written into three memory cells MC of the same row while the "H" level is written to other memory cells MC.

When an attempt is made to write the test pattern as the one shown in FIG. 17 with a tester, there is a need to make data signal DQ3 an inverted data signal of data signals DQ0 to DQ2 for the group in which column address signal Y is n−1, while there is a need to make data signals DQ0, DQ1 the inverted data signals of data signals DQ2, DQ3 for the group in which column address signal Y is n. In other words, the combination of data signals DQ to be inverted must be changed according to column address signal Y. and an extremely complicated pattern program would be required to effect such change so that the implementation becomes difficult.

SUMMARY OF THE INVENTION

Thus, the principal object of the present invention is to provide a semiconductor memory device that allows easy writing of a test pattern.

The semiconductor memory device according to the present invention is provided with a write data inverting circuit for receiving externally supplied N data signals and for outputting each data signal inverted or uninverted based on a data control signal, a write circuit for writing N data signals output from the write data inverting circuit into N memory cells that are rendered active by a row select circuit via N bit line pairs selected by a column select circuit, and a plurality of address signal input terminals for inputting a row address signal and a column address signal at different timing, where the data control signal is input along with the column address signal using an address signal input terminal among the plurality of address signal input terminals which is not used for inputting of the column address signal. Thus, each data signal, inverted or uninverted, can be written into a memory cell by inputting N data signals of the same logic and by inputting a column address signal and a data control signal via a plurality of address signal input terminals. In this manner, a test pattern can be easily written without using a complicated pattern program. Moreover, the data control signal is input along with the column address signal using an address signal input terminal not used for inputting of the column address signal so that no increase in the number of signal input terminals and in the write time takes place.

Preferably, the semiconductor memory device according to the present invention is further provided with a read circuit for reading data signals of N memory cells rendered active by the row select circuit via N bit line pairs selected by the column select circuit, a read data inverting circuit for receiving N data signals read by the read circuit and for outputting each data signal inverted or uninverted based on the data control signal, and N data input/output terminals for outputting to outside N data signals output from the read data inverting circuit and for supplying N data signals to the write data inverting circuit (32, 34) from outside. In this case, a memory cell that is the test target can be determined to be normal when the logic of an input data signal matches the logic of an output data signal.

More preferably, the number N of bit line pairs selected by the column select circuit can be changed, and each of the write data inverting circuit and the read data inverting circuit outputs each data signal inverted or uninverted based on the data control signal and a word configuration instruction signal indicating the number N of bit line pairs selected by the column select circuit. In this case, a data signal can be inverted according to the word configuration.

More preferably, the semiconductor memory device according to the present invention is further provided with a decoder for causing each of N inversion instruction signals corresponding to N data signals to attain the active level or inactive level based on the word configuration instruction signal and the data control signal, where the write data inverting circuit includes N first inverting circuits which are respectively provided corresponding to externally supplied N data signals and each of which inverts a corresponding data signal when a corresponding inversion instruction signal is at the active level and allows the corresponding data signal to pass through without inversion when the corresponding inversion instruction signal is at the inactive level, and the read data inverting circuit includes N second inverting circuits which are respectively provided corresponding to N data signals read by the read circuit and each of which inverts a corresponding data signal when a corresponding inversion instruction signal is at the active level and allows the corresponding data signal to pass through without inversion when the corresponding inversion instruction signal is at the inactive level. In this case, the write data inverting circuit and the read data inverting circuit can be configured with ease.

More preferably, the semiconductor memory device according to the present invention is further provided with a switching circuit for supplying to each of N first inverting circuits a data signal externally supplied via a predetermined data input/output terminal of N data input/output terminals during a test mode, and a match/mismatch determination circuit for determining whether the logic of N data signals output from N second inverting circuits match and for supplying a signal of a level corresponding to a result of determination to the predetermined data input/output terminal during the test mode. In this case, N memory cells can be simultaneously tested to determine whether they are normal or not by connecting only one data input/output terminal of N data input/output terminals to a tester so that the greater number of semiconductor memory devices can be tested simultaneously using one tester, and reduction in the test cost can be achieved.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 12A to 12E are timing charts showing a write operation in a test mode of the SDRAM shown in FIGS. 1 to 11.

FIGS. 13A to 13E are timing charts showing a read operation in a test mode of the SDRAM shown in FIGS. 1 to 11.

DESCRIPTION OF THE PREFERRED EMBODIMENTS

First Embodiment

Figure 1:
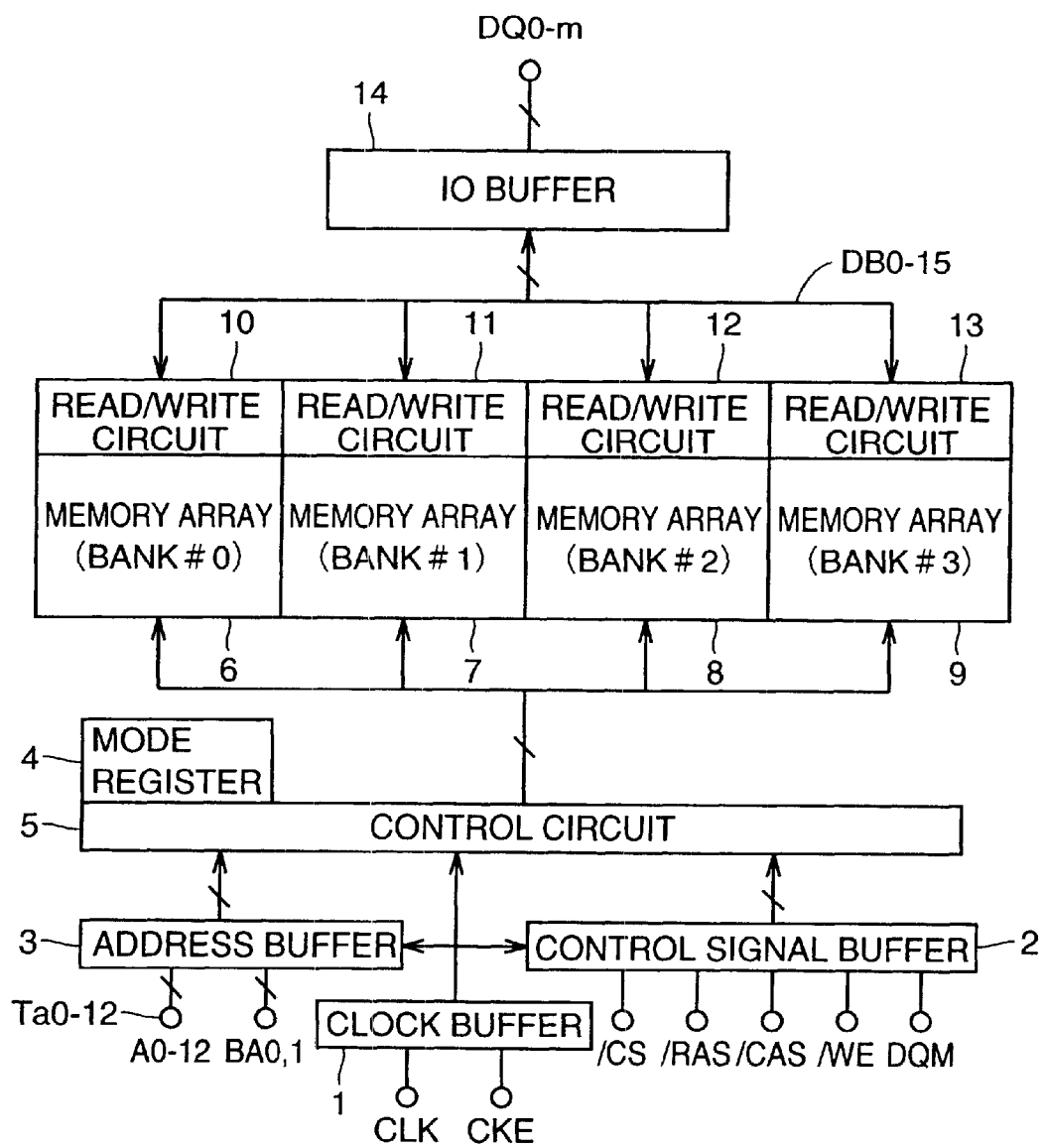
FIG. 1 is a block diagram representing an overall arrangement of an SDRAM according to a first embodiment of the present invention.

FIG. 1 is a block diagram representing an overall arrangement of an SDRAM according to the first embodiment of the present invention. As shown in FIG. 1, the SDRAM is provided with a clock buffer 1, a control signal buffer 2, an address buffer 3, a mode register 4, a control circuit 5, four memory arrays 6 to 9 (banks #0 to #3), four read/write circuits 10 to 13, and an IO buffer 14.

Clock buffer 1 is activated by an external control signal CKE and transmits an external clock signal CLK to control signal buffer 2, address buffer 3, and control circuit 5. Control signal buffer 2 latches external control signals /CS, /RAS, /CAS, /WE, DQM and supplies the latched external control signals to control circuit 5 in synchronization with external clock signal CLK from clock buffer 1. Address buffer 3 latches bank selecting signals BA0, BA1 supplied from outside and address signals A0 to A12 supplied via address signal input terminals Ta0 to Ta12 from outside and supplies the latched signals to control circuit 5 in synchronization with external clock signal CLK from clock buffer 1.

Mode register 4 stores a mode instructed by external address signals A0 to A12 and outputs an internal command signal corresponding to that mode. Each of memory arrays 6 to 9 includes a plurality of memory cells which are arranged in a matrix of rows and columns and each of which stores one-bit data. The plurality of memory cells are divided into groups of m+1 memory cells (m is a number pre-selected from 3, 7, and 15) in advance.

Control circuit 5 generates a plurality of internal signals according to signals from clock buffer 1, control signal buffer 2, address buffer 3, and mode register 4, and controls the entire SDRAM. During a read operation and a write operation, control circuit 5 selects one of four memory arrays 6 to 9 according to bank selecting signals BA0, BA1 and selects m+1 memory cells from the selected memory array according to address signals A0 to A12.

Read/write circuits 10 to 13 reads data Q0 to Qm from m+1 memory cells selected by control circuit 5 during the read operation, and writes data D0 to Dm into m+1 memory cells selected by control circuit 5 during the write operation.

Read/write circuits 10 to 13 are coupled to IO buffer 14 via data buses DB0 to DB15.

IO buffer 14 outputs read data Q0 to Qm from read/write circuits 10 to 13 to the outside during the read operation, and supplies externally input data D0 to Dm to read/write circuits 10 to 13 during the write operation.

Figure 2:
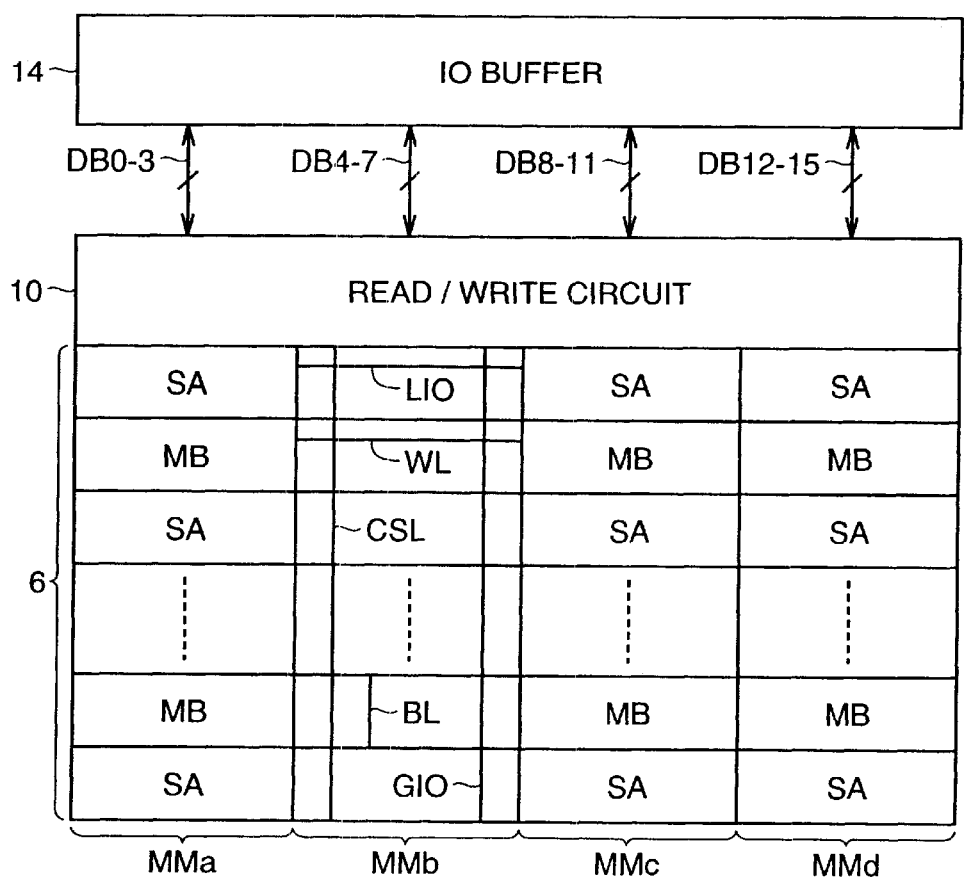
FIG. 2 is a block diagram representing an arrangement of a memory array shown in FIG. 1.

FIG. 2 is a block diagram representing an arrangement of memory array 6 shown in FIG. 1. Memory array 6 is divided into four memory mats MMa to MMd. Memory mats MMa to MMd are provided corresponding to data buses DB0 to DB3, data buses DB4 to DB7, data buses DB8 to DB11, and data buses DB12 to DB15, respectively.

This SDRAM allows for the selection of any word configuration from three word configurations of x4, x8, and x16. The x4, x8, and x16 word configurations allows for simultaneous input/output of data having four bits, eight bits, and sixteen bits, respectively.

During the read operation in the x4 configuration, read/write circuit 10 reads data of four bits in total, one bit from each of memory mats MMa to MMd, and these four bits of data are respectively supplied to IO buffer 14 via data buses DB0, DB4, DB8, and DB12.

During the write operation in the x4 configuration, IO buffer 14 supplies data of four bits to read/write circuit 10 via data buses DB0, DB4, DB8, and DB12, and these four bits of data are respectively written into memory mats MMa to MMd.

During the read operation in the x8 configuration, read/write circuit 10 reads data of eight bits in total, two bits from each of memory mats MMa to MMd, and these eight bits of data are respectively supplied to IO buffer 14 via data buses DB0, DB2, DB4, DB6, DB8, DB10, DB12, and DB14.

During the write operation in the x8 configuration, IO buffer 14 supplies data of eight bits to read/write circuit 10 via data buses DB0, DB2, DB4, DB6, DB8, DB10, DB12, and DB14, and these eight bits of data are written into memory mats MMa to MMd, two bits per memory mat.

During the read operation in the x16 configuration, read/write circuit 10 reads data of sixteen bits in total, four bits from each of memory mats MMa to MMd, and these sixteen bits of data are respectively supplied to IO buffer 14 via data buses DB0 to DB 15.

During the write operation in the x16 configuration, IO buffer 14 supplies data of sixteen bits to read/write circuit 10 via data buses DB0 to DB15, and these sixteen bits of data are written into memory mats MMa to MMd, four bits per memory mat.

Since four memory mats MMa to MMd have the same arrangement, only the portion relating to memory mat MMa will be described below. Memory mat MMa includes a plurality of sense amplifier bands SA and a plurality of memory blocks MB. Each memory block MB is provided between two sense amplifier bands SA.

Figure 3:
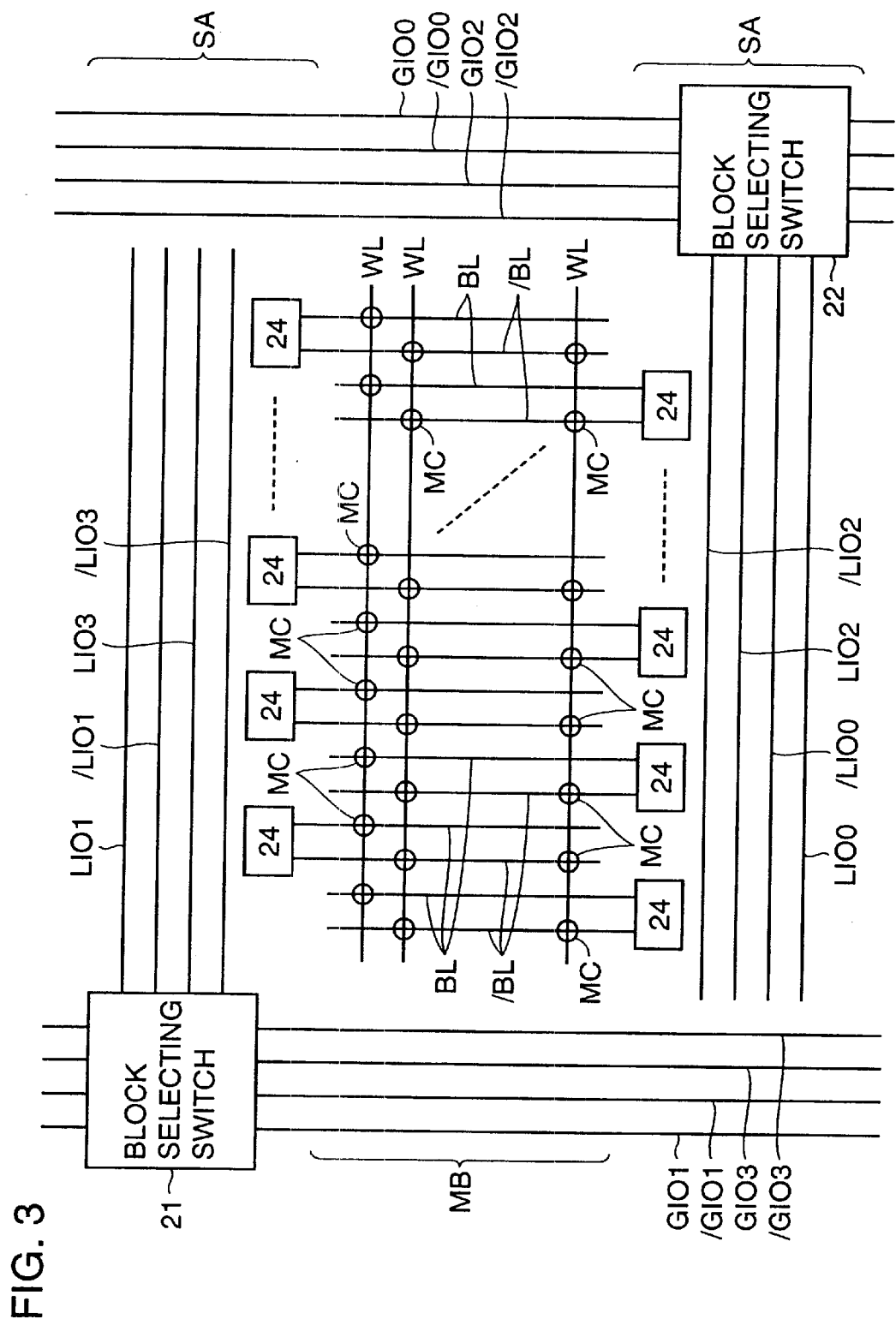
FIG. 3 is a block diagram representing the arrangement of a memory block and a sense amplifier band shown in FIG. 2.

As shown in FIG. 3, memory block MB includes a plurality of memory cells MC arranged in multiple rows and columns, a plurality of word lines WL provided corresponding to the multiple rows, and a plurality of bit line pairs BL, /BL provided corresponding to the multiple columns. The plurality of bit line pairs BL, /BL are divided into groups of four bit line pairs in advance.

In the upper sense amplifier band SA of memory block MB as shown in the diagram, two local IO line pairs LIO1, /LIO1 and LIO3, /LIO3 are arranged in parallel to a word line WL, and in the lower sense amplifier band SA of memory block MB as shown in the diagram, two local IO line pairs LIO0, /LIO0 and LIO2, /LIO2 are arranged in parallel to a word line WL.

Moreover, on the left side as shown in the diagram of memory block MB, two global IO line pairs GIO1, /GIO1 and GIO3, /GIO3 are arranged in parallel to a bit line pair BL, /BL, and on the right side as shown in the diagram of memory block MB, two global IO line pairs GIO0, /GIO0 and GIO2, /GIO2 are arranged in parallel to a bit line pair BL, /BL. Four global IO line pairs GIO0, /GIO0 to GIO3, /GIO3 are arranged so as to traverse the plurality of sense amplifier bands SA and the plurality of memory blocks MMB.

A block selecting switch 21 is disposed in the intersecting portion of local IO line pairs LI01, /LI01 and LI03, /LI03 and global IO line pairs GIO1, /GIO1 and GIO3, /GIO3, and a block selecting switch 22 is disposed in the intersecting portion of local IO line pairs LIO0, /LIO0 and LI02, /LI02 and global IO line pairs GIO0, /GIO0 and GIO2, /GIO2.

When one bit line pair group of this memory block MB is selected by address signals A0 to A12, block selecting switches 21 and 22 are rendered conductive. Two even-number bit line pairs BL, /BL of four bit line pairs BL, /BL belonging to the selected group are connected to global IO line pairs GIO1, /GIO1 and GIO3, /GIO3 via local IO line pairs LIO1, /LIO1 and LI03, /LI03 and block selecting switch 21. Two odd-number bit line pairs BL, /BL are connected to global IO line pairs GIO0, /GIO0 and GIO2, /GIO2 via local IO line pairs LIO0, /LIO0 and LI02, /LI02 and block selecting switch 22.

In the x4 configuration, one of four global IO line pairs GIO0, /GIO0 to GIO3, /GIO3 is selected, and data is communicated between the selected global IO line pair and data bus DB0.

In the x8 configuration, one of two global IO line pairs GIO0, /GIO0 and GIO1, /GIO1 is selected, while at the same time, one of two global IO lines GIO2, /GIO2 and GIO3, /GIO3 is selected, and data is communicated between the two selected global IO line pairs and data buses DB0, DB2, respectively. In the x16 configuration, data is communicated between four global 10 line pairs GIO0, /GIO0 to GIO3, /GIO3 and four data buses DB0 to DB3, respectively.

Figure 4:
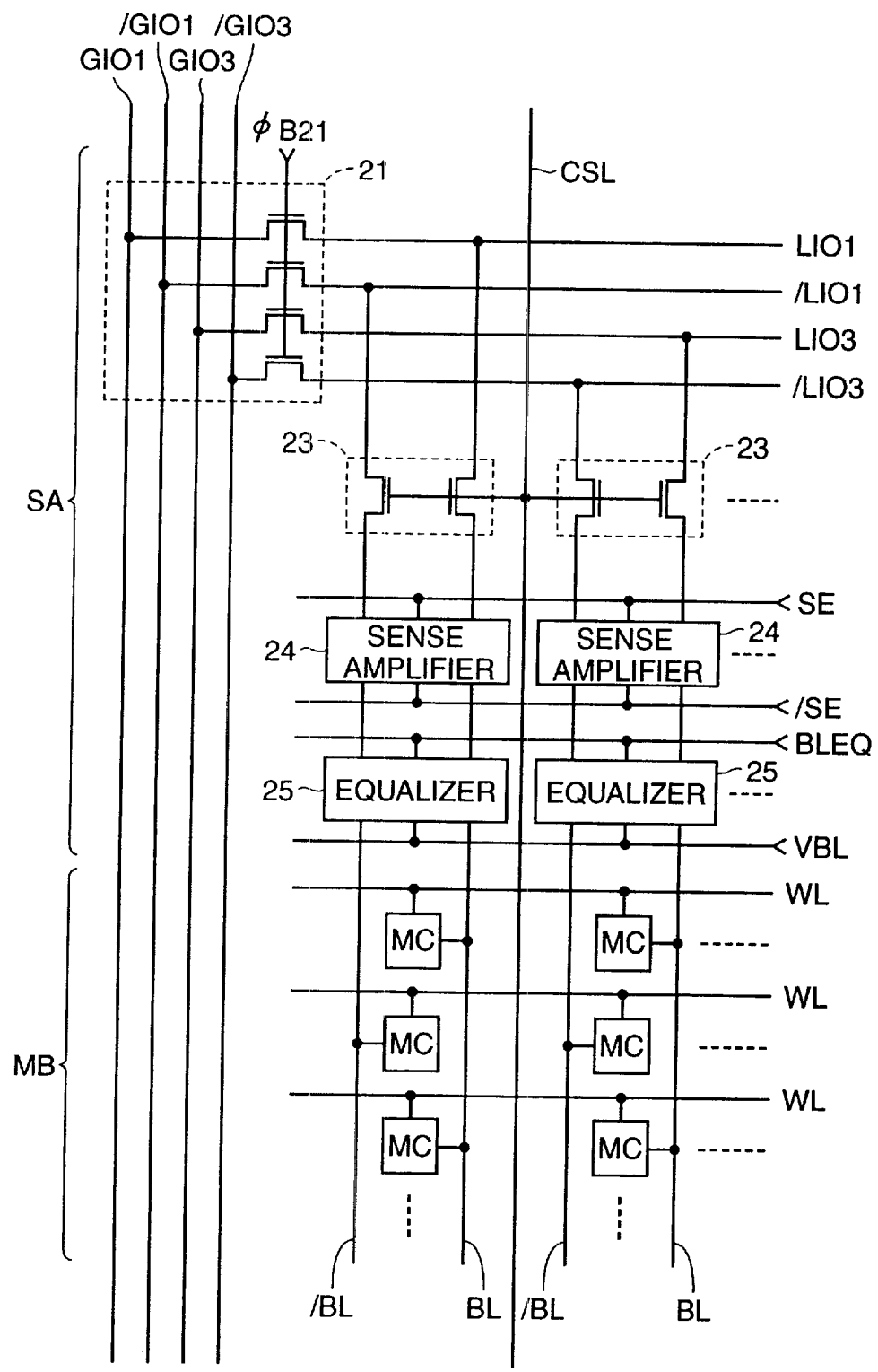
FIG. 4 is a circuit block diagram showing in further detail the arrangement of the sense amplifier band shown in FIG. 3.

FIG. 4 is a circuit block diagram showing a portion relating to even-number bit line pairs BL, /BL among the plurality of bit line pairs BL, /BL shown in FIG. 3. As shown in FIG. 4, block selecting switch 21 includes four N-channel MOS transistors. The four N-channel MOS transistors are respectively connected between local IO lines LIO1, /LIO1, LIO3, and /LIO3 and global IO lines GIO1, /GIO1, GIO3, and /GIO3, and their gates all receive a block selecting signal φB21. Block selecting signal φB21 is generated based on address signals A0 to A12. When signal φB21 attains the active level or the "H" level, four N-channel MOS transistors of block selecting switch 21 are rendered conductive, and local IO lines LIO1, /LIO1, LI03, and /L1O3 are respectively connected to global IO lines GIO1, /GIO1, GIO3, and /GIO3.

In addition, a column select gate 23, a sense amplifier 24, and an equalizer 25 are provided correspondingly to each column in the upper sense amplifier band SA of memory block MB as shown in the diagram. Column select gate 23 includes two N-channel MOS transistors. The two N-channel MOS transistors of column select gate 23 corresponding to one of two bit line pairs BL, /BL belonging to the same bit line pair group are connected between the corresponding bit lines BL, /BL and local IO lines LIO1, /LIO1, while the two N-channel MOS transistors of column select gate 23 corresponding to the other bit line pair BL, /BL are connected between the corresponding bit lines BL, /BL and local IO lines LI03, /L1O3. One column select line CSL is provided correspondingly to each bit line pair group, and gates of two N-channel MOS transistors of each column select gate 23 corresponding to the bit line group are connected to a corresponding column select line CSL. Column select line CSL is provided in common to a plurality of sense amplifier bands SA.

When one column select line CSL is selected according to an address signal and that column select line CSL attains the select level or the "H" level, each column select gate 23 corresponding to the column select line CSL is rendered conductive, and two bit line pairs BL, /BL are connected to local IO line pairs LIO1, /LIO1 and LIO3, /LIO3 via column select gates 23, 23.

Sense amplifier 24 amplifies the small potential difference between bit line pair BL, /BL to a power-supply voltage VCC in response to sense amplifier activating signals SE, /SE respectively attaining the "H" level and the "L" level. Equalizer 25 equalizes the potentials of bit lines BL and /BL to a bit line potential VBL in response to a bit line equalize signal BLEQ attaining the active level or the "H" level.

In addition, memory cell MC is of a well-known type which includes an accessing N-channel MOS transistor and a capacitor for storing information. Moreover, the portion relating to odd-number bit line pair BL, /BL has an arrangement similar to the portion relating to even-number bit line pair BL, /BL.

Now, an operation of the SDRAM shown in FIGS. 1 to 4 will be described. For the purpose of description, however, it is assumed that the SDRAM is set to the x16 configuration and that a bank #0 is being selected by bank selecting signals BA0, BA1, and only the operation of the portion relating to memory mat MMa of bank #0 will be described.

In a read mode, first, bit line equalize signal BLEQ attains the inactive level or the "L" level, and the equalizing operation of bit line pair BL, /BL is stopped, while at the same time, control circuit 5 raises to the select level or the "H" level a word line WL corresponding to row address signals RA0 to RA12 (address signals A0 to A12 input at the time an external control signal /RAS fell to the active level or the "L" level). Consequently, each memory cell MC corresponding to that word line WL is activated, and a small potential difference is generated between bit lines BL, /BL corresponding to each activated memory cell MC. Thereafter, sense amplifier activating signals SE, ISE respectively attain the "H" level and the "L" level, thereby rendering sense amplifier 24 active, and sense amplifier 24 amplifies the small potential difference between the bit lines BL, /BL to power-supply voltage VCC.

Then, control circuit 5 raises to the select level or the "H" level a column select line CSL corresponding to column address signals CA0 to CA8 (address signals A0 to A12 input at the time an external control signal /CAS fell to the active level or the "L" level), and each column select gate 23 corresponding to that column select line CSL is rendered conductive. In addition, a block selecting switch (21 or 22, for instance) corresponding to memory block MB to which the selected word line WL belongs is rendered conductive. In this manner, four selected bit line pairs BL, /BL are connected to read/write circuit 10 via local IO line pairs LIO1, /LIO1 to LIO3, /LIO3 and global IO line pairs GIO0, /GIO0 to GIO3, /GIO3, respectively.

Read/write circuit 10 converts the potential differences between global IO line pairs GIO0, /GIO0 to G1O3, /GIO3 into data signals Q0 to Q3 which are then output to the outside via data buses DB0 to DB3 and IO buffer 14.

In a write mode, as in the read mode, four activated memory cells MC are connected to read/write circuit 10 via four bit line pairs BL, /BL, local 10 line pairs LIO0, /LIO0 to LIO3, /LIO3, and global IO line pairs GIO0, /GIO0 to GIO3, /GIO3.

IO buffer 14 causes one of global IO lines of each of global IO line pairs GIO0, /GIO0 to GIO3, /GIO3 to attain the "H" level and the other of global IO lines to attain the "L" level according to the logic of external data signals D0 to D3. Consequently, one of the selected bit lines BL and /BL attains the "H" level while the other attains the "L" level, and charges of the amount corresponding to the potential of bit line BL or bit line /BL is accumulated in the capacitor of the activated memory cell MC.

Figure 5:
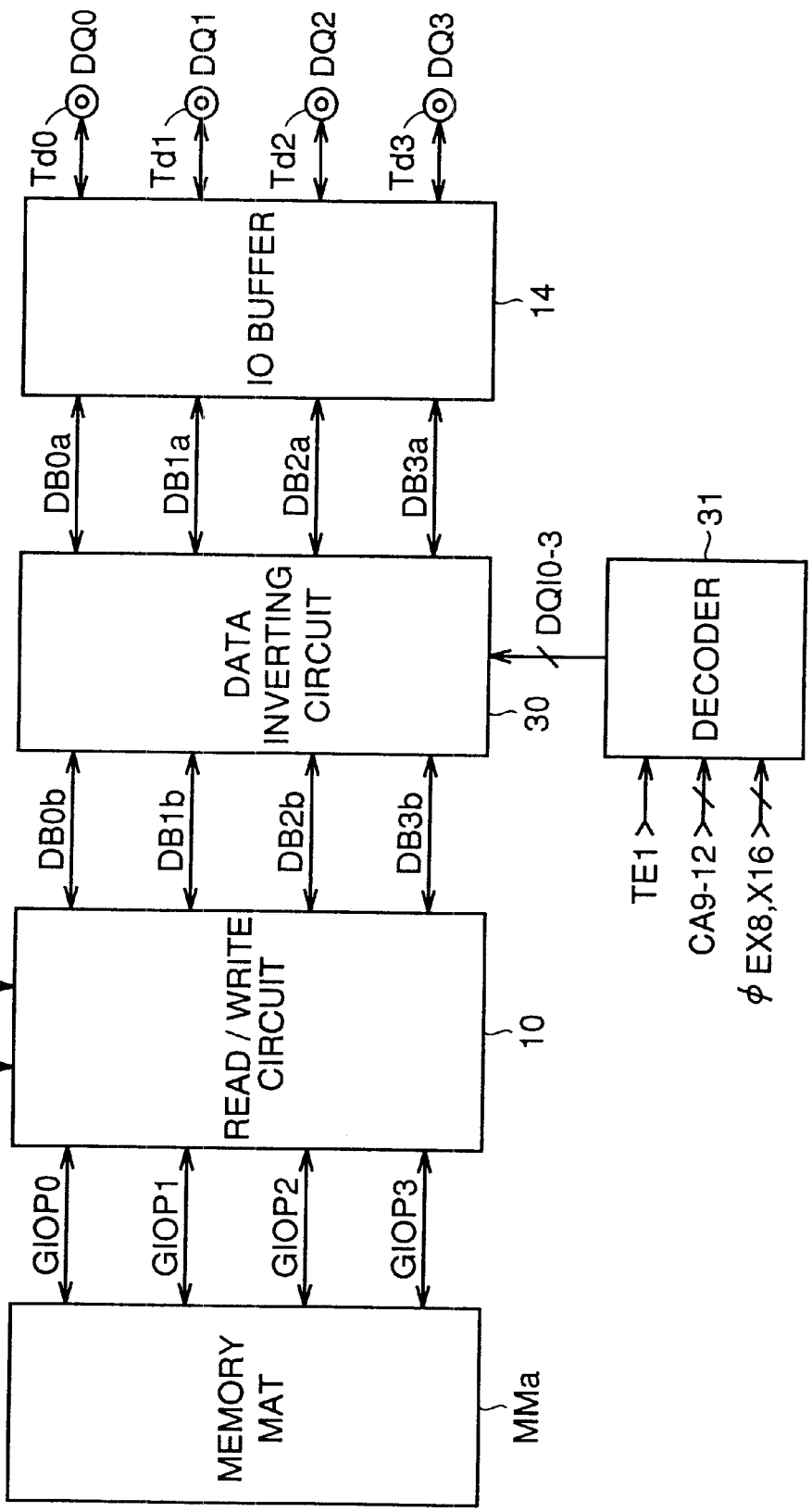
FIG. 5 is a block diagram showing a data inverting circuit and a decoder included in the SDRAM shown in FIG. 1.

The test mode characterizing the SDRAM of the first embodiment will be described in detail below. As shown in FIG. 5, a data inverting circuit 30 and a decoder 31 are additionally provided in the SDRAM. Data inverting circuit 30 is interposed along data buses DB0 to DB3. Data inverting circuit 30 divides data buses DB0 to DB3 into data buses DB0*a* to DB3*a* on IO buffer 14 side and data buses DB0*b* to DB3*b* on read/write circuit 10 side.

Data inverting circuit 30 is controlled by output signals DQI0 to DQI3 from decoder 31 corresponding to the respective data signals DQ0 to DQ3. During the write operation, data inverting circuit 30 inverts the logic of data signals (in this case, D0, D1), whose corresponding signals (for instance, DQI0, DQI1) having attained the "H" level, among data signals D0 to D3 externally supplied via IO buffer 14 and data buses DB0*a* to DB3*a* and transmits the inverted signals to data buses DB0*b*, DB1*b*, while at the same time, transmits to data buses DB2*b*, DB3*b* without inversion the signals D2, D3 whose corresponding signals DQI2, DQI3 are at the "L" level.

Moreover, during the read operation, data inverting circuit 30 inverts the logic of data signals (in this case, Q0, Q1), whose corresponding signals (for instance, DQI0, DQI1) having attained the "H" level, among data signals Q0 to Q3 supplied via data buses DB0B to DB3*b* from read/write circuit 10 and transmits the inverted signals to data buses DB0*a*, DB1*a*, while at the same time, transmits to data buses DB2*a*, DB3*a* without inversion the signals Q2, Q3 whose corresponding signals DQI2, DQI3 are at the "L" level.

Figure 6:
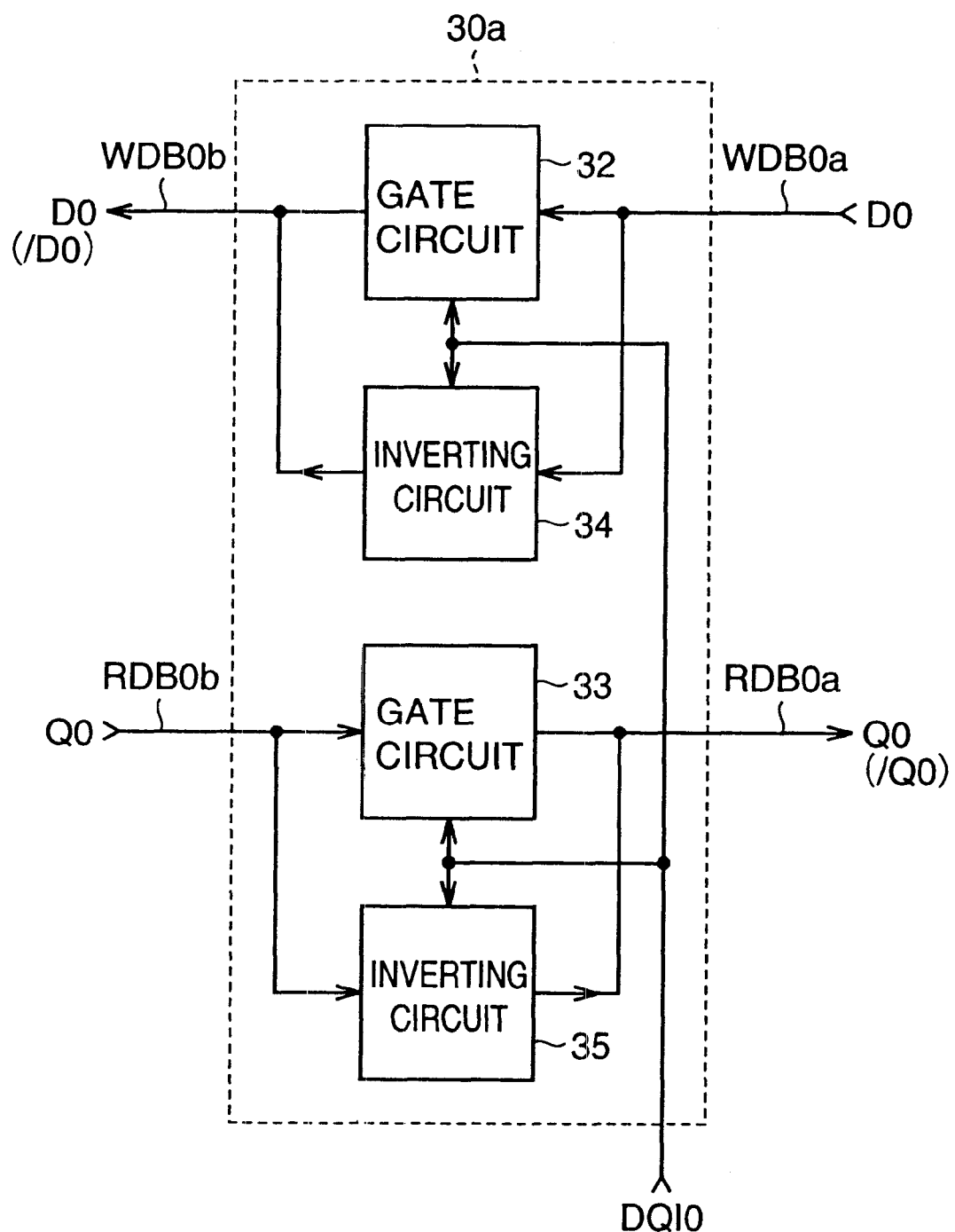
FIG. 6 is a block diagram representing a main portion of the data inverting circuit shown in FIG. 5.

FIG. 6 is a block diagram showing a portion 30a relating to data bus DB0 of data inverting circuit 30. As shown in FIG. 6, data bus DB0 includes a write data bus WDB0 and a read data bus RDB0. Data inverting circuit 30*a* divides data buses WDB0, RDB0 into data buses WDB0*a* and WDB0*b*, and RDB0*a* and RDB0*b*.

Data inverting circuit 30*a* includes gate circuits 32, 33, and inverting circuits 34, 35. Gate circuit 32 is connected between data buses WDB0*b* and WDB0*a*, and inverting circuit 34 is connected in parallel to gate circuit 32. Gate circuit 33 is connected between data buses RDB0*b* and RDB0*a*, and inverting circuit 35 is connected in parallel to gate circuit 33.

When a signal DQI0 is at the inactive level or the "L" level, gate circuit 32 supplies to read/write circuit 10 via data bus WDB0*b* a write data signal D0 supplied via data bus WDB0*a* from IO buffer 14. When signal DQI0 is at the active level or the "H" level, inverting circuit 34 generates a data signal /D0 by inverting data signal D0 supplied via data bus WDB0*a* from 10 buffer 14 and supplies data signal /D0 via data bus WDB0*b* to read/write circuit 10.

When a signal DQI0 is at the inactive level or the "L" level, gate circuit 33 supplies to IO buffer 14 via data bus RDB0a a read data signal Q0 supplied via data bus RDB0b from read/write circuit 10. When signal DQI0 is at the active level or the "H" level, inverting circuit 35 generates a data signal /Q0 by inverting data signal Q0 supplied via data bus RDB0b from read/write circuit 10 and supplies data signal /Q0 via data bus RDB0a to 10 buffer 14. The portions relating to data buses DB1 to DB3 of data inverting circuit 30 is similar to portion 30a relating to data bus DB0.

Decoder 31 is rendered active when a test signal TE1 is at the active level or the "H" level, and generates signals DQI0 to DQI3 according to column address signals CA9 to CA12 and word configuration activating signals φEx8, φEx16. When signal φEx8 is at the active level or the "H" level, the SDRAM would have the x8 configuration. When signal φEx16 is at the active level or the "H" level, the SDRAM would have the x16configuration. Moreover, when signal φEx4 is at the active level or the "H" level, the SDRAM would have the x4 configuration. One of the signals φEx4, φEx8, and φEx16 attains the active level or the "H" level.

In addition, read/write circuit 10 is controlled by word configuration activating signals φEx4, φEx8, φEx16 and signals CBS0 to CBS3. Signals CBS0 to CBS3 are the signals that are generated based on column address signals CA9 and CA1 land that are used for selecting global IO line pairs GIOP0 to GIOP3. In the x4 configuration, one of signals CBS0 to CBS3 (for instance, CBS3) attains the "H" level, and global IO line pair GIOP3 corresponding to signal CBS3 is coupled to data bus DB0b via read/write circuit 10.

In the x8 configuration, one of signals CBS0, CBS1 (for instance, CBS 1) and one of signals CBS2, CBS3 (for instance, CBS2) attain the "H" level, and global IO line pairs GIOP1, GIOP2 corresponding to those signals CBS 1, CBS2 are coupled to data buses DB0b, DB2b via read/write circuit 10. In the x16 configuration, signals CBS0 to CBS3 all attain the "H" level, and global IO line pairs GIOP1 to GIOP3 are respectively coupled to data buses DB0b to DB3b via read/write circuit 10.

Figure 7:
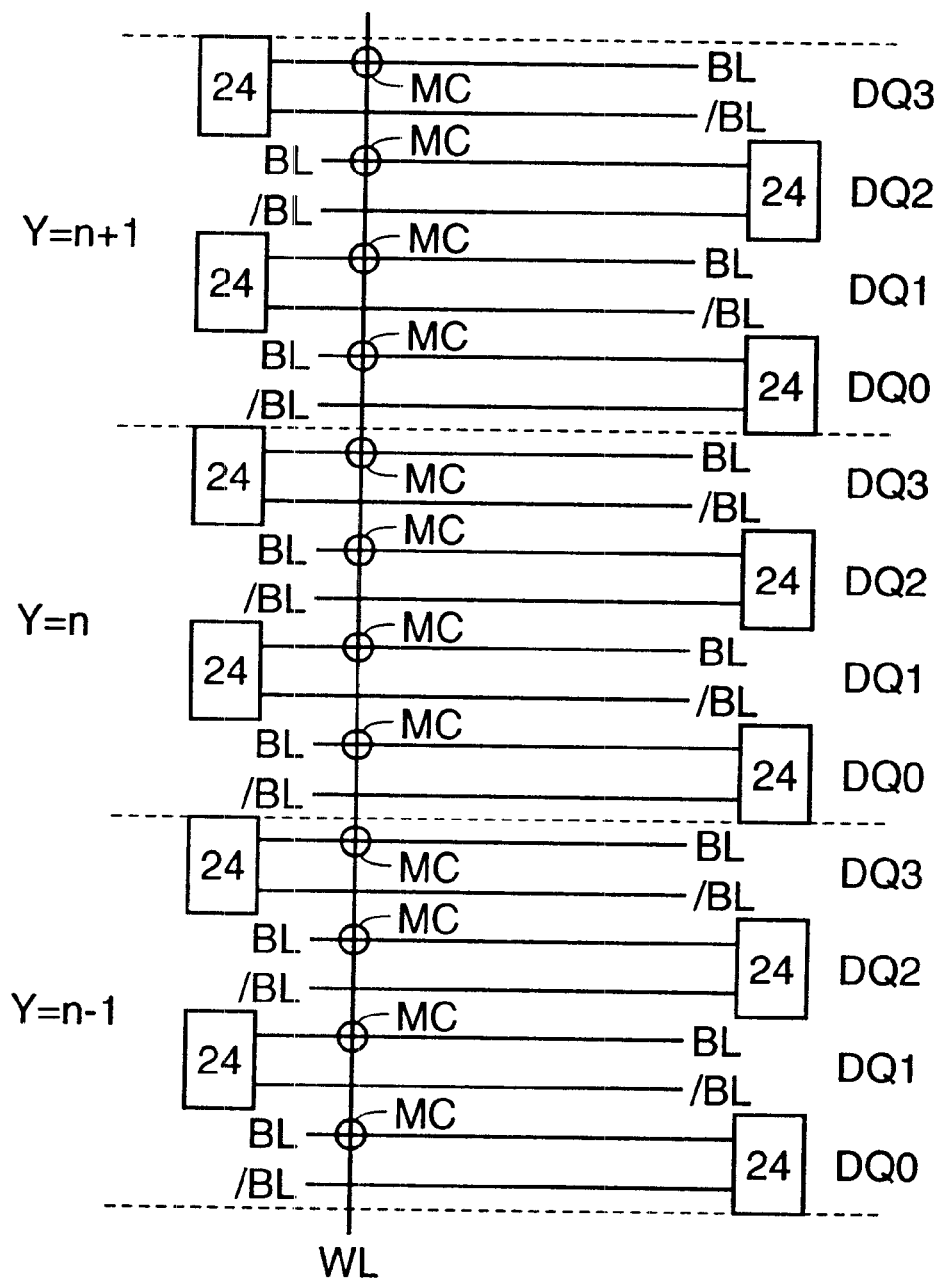
FIG. 7 is a diagram showing the relations among a column address signal, a data signal, and a bit line pair in a x16 configuration.

An operation of decoder 31 will be described in detail below. FIG. 7 is a block diagram representing the relations among column address signal Y (CA0 to CA8), data signals DQ0 to DQ3, and bit line pairs BL, /BL in a x16 configuration. As shown in FIG. 7, a plurality of bit line pairs BL, /BL of memory block MB are divided into groups of four bit line pairs in advance. FIG. 7 shows three groups. Unique column address signals Y=n-1, Y=n, Y=n+1 are respectively assigned to the three groups. The first to fourth bit line pairs BL, /BL of each group are respectively used for inputting/outputting of data signals DQ0 to DQ3.

In the x16 configuration, column address signals CA9, CA11, CA12 are not used. Column address signal CA10 is used for inputting of a read/write command with auto-precharge during a normal operation. When the test mode shown in this first embodiment is entered, and when signal CA12 at the time read/write command is input is caused to attain the "H" level, however, signal CA10 is not used for setting of an auto-precharge command. Thus, in this SDRAM, when the test mode is entered and when signal CA12 is at the "H" level, column address signals CA9 to CA11 are used for the generation of output signals DQI0 to DQI3 of decoder 31.

Figures 8, 9:
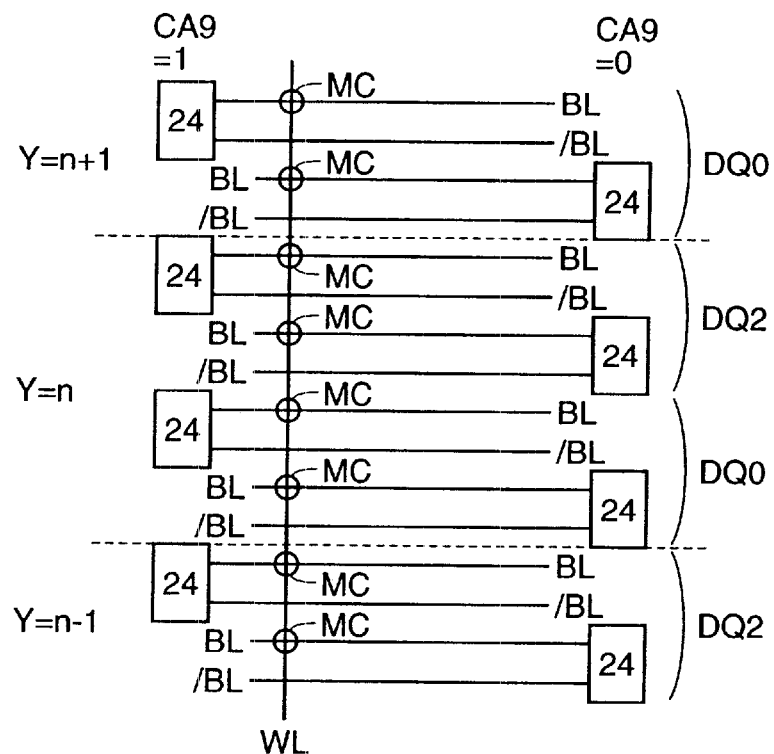
FIG. 8 is a diagram showing the relations among a cell of interest, a data signal to be inverted, and a column address signal in the x16 configuration.
FIG. 9 is a diagram showing the relations among a column address signal, a data signal, and a bit line pair in a x8 configuration.

FIG. 8 is a diagram showing the relation between a memory cell MC of interest as a test target and column address signals CA9 to CA12 that are input when a write or read operation of a data signal of that memory cell MC is performed in the x16 configuration. Without data inverting circuit 30, the logic levels of data signals D0 to D3 are set such that the "H" level is written into all the memory cells MC connected to one word line WL.

Referring to FIGS. 7 and 8, when cell MC of interest is the memory cell MC corresponding to data signal DQ0 that is input/output via the first bit line pair BL, /BL of the bit line pair group designated by column address signal Y(CA0 to CA8)=n, there is a need (1) to invert data signal DQ3 that is input/output via the fourth bit line pair BL, /BL of the group designated by column address signal Y=n-1 as well as (2) to invert data signals DQ0, DQ1 that are input/output via the first and second bit line pairs BL, /BL of the group designated by column address signal Y=n.

In addition, when cell MC of interest is the memory cell MC corresponding to data signal DQ1 that is input/output via the second bit line pair BL, /BL of the group designated by column address signal Y=n, there is a need (3) to invert data signals DQ0 to DQ2 that are input/output via the first to third bit line pairs BL, /BL of the group designated by column address signal Y=n.

Moreover, when cell MC of interest is the memory cell MC corresponding to data signal DQ2 that is input/output via the third bit line pair BL, /BL of the group designated by column address signal Y=n, there is a need (4) to invert data signals DQ1 to DQ3 that are input/output via the second to fourth bit line pairs BL, /BL of the group designated by column address signal Y=n.

Furthermore, when cell MC of interest is the memory cell MC corresponding to data signal DQ3 that is input/output via the fourth bit line pair BL, /BL of the group designated by column address signal Y=n, there is a need (5) to invert data signals DQ2, DQ3 that are input/output via the third and fourth bit line pairs BL, /BL of the group designated by column address signal Y=n as well as (6) to invert data signal DQ0 that is input/output via the first bit line pair BL, /BL of the group designated by column address signal Y=n+1.

Then, unique column address signals CA9 to CA12 are respectively assigned to the above-described cases (1) to (6). Signal CA12 is fixed to the "H" level (1) as described above. For instance, in the above-described cases of (1) to (6), CA11 to CA9=000, 001,010, . . . , 101, respectively. When none of data signals DQ0 to DQ3 is inverted, CA11 to CA9=111, for instance.

When test signal TE1 attains the active level or the "H" level and when word configuration activating signal φEx16 attains the active level or the "H" level, decoder 31 causes a signal DQ1, which corresponds to a data signal DQ to be inverted, to attain the active level or the "H" level according to signals CA9 to CA12. For instance, when CA9 to CA12=0001 is input, decoder 31 causes signal DQI3 corresponding to data signal DQ3 to attain the active level or the "H" level, and causes signals DQI0 to DQI2 corresponding to other data signals DQ0 to DQ2 to attain the inactive level or the "L" level. Accordingly, data inverting circuit 30 inverts data signal DQ3 as well as allows data signals DQ0 to DQ2 to pass through.

FIG. 9 is a diagram showing the relations among a column address signal Y (CA0 to CA8), CA9, data signals DQ0, DQ2, and bit line pairs BL, /BL in a x8 configuration. As shown in FIG. 9, a plurality of bit line pairs BL, /BL of memory block MB are divided into groups of four bit line pairs in advance. FIG. 9 shows a portion of two groups and one whole group. Unique column address signals Y=n-1, Y=n, Y=n+1 are respectively assigned to the three groups. Column address signal CA9=0 is assigned to the first and third bit line pairs BL, /BL of each group, and column address signal CA9=1 is assigned to the second and fourth bit line pairs BL, /BL of each group. The first and second bit line pairs BL, /BL of each group are used for inputting/outputting of data signal DQ0, and the third and fourth bit line pairs BL, /BL of each group are used for inputting/outputting of data signal DQ1.

In the x8 configuration, column address signals CA11, CA12 are not employed at the time read/write command is input. Thus, when the SDRAM enters into the test mode, column address signals CA11, CA12 are used for the generation of output signals DQI0 to DQI3 of decoder 31 at the time read/write command is input.

Figures 10, 11:
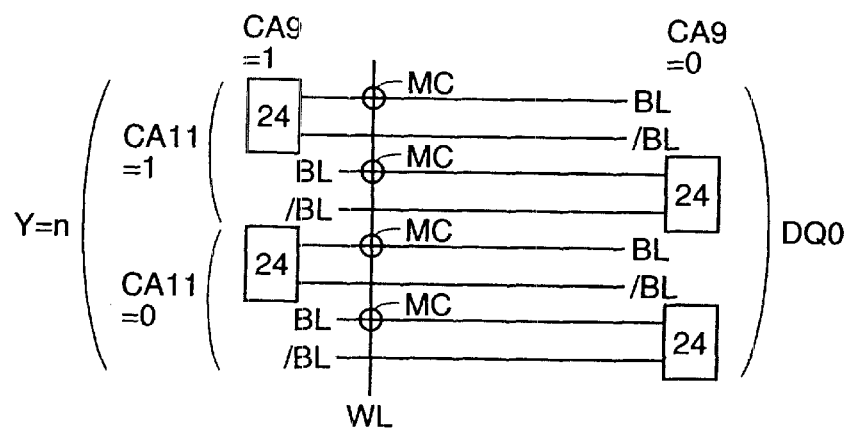
FIG. 10 is a diagram showing the relations among a cell of interest, a data signal to be inverted, and a column address signal in the x8 configuration.
FIG. 11 is a diagram showing the relations among a column address signal, a data signal, and a bit line in a x4 configuration.

FIG. 10 is a diagram showing the relations between a memory cell MC of interest as a test target and column address signals CA11, CA12 that are input when data of that memory cell MC is written/read in the x8 configuration. Without data inverting circuit 30, the logic levels of data signals D0, D2 are set such that the "H" level is written into all the memory cells MC connected to one word line WL.

Referring to FIGS. 9 and 10, when cell MC of interest is the memory cell MC corresponding to data signal DQ0 that is input/output via the first (CA9=0) bit line pair BL, /BL of the bit line pair group designated by column address signal Y=n, there is a need to invert (a) data signal DQ2 that is input/output via the fourth (CA9=1) bit line pair BL, /BL of the group designated by column address signal Y=n−1, (b) data signal DQ0 that is input/output via the first (CA9=0) bit line pair BL, /BL of the group designated by column address signal Y=n, and (c) data signal DQ0 that is input/output via the second (CA9=1) bit line pair BL, /BL of the group designated by column address signal Y=n.

In addition, when cell MC of interest is the memory cell MC corresponding to data signal DQ0 that is input/output via the second (CA9=1) bit line pair BL, /BL of the group designated by column address signal Y=n, there is a need to invert (d) data signals DQ0, DQ2 that are input/output via the first and third (CA9=0) bit line pairs BL, /BL of the group designated by column address signal Y=n, and (e) data signal DQ0 that is input/output via the second (CA9=1) bit line pair BL, /BL of the group designated by column address signal Y=n.

Moreover, when cell MC of interest is the memory cell MC corresponding to data signal DQ2 that is input/output via the third (CA9=0) bit line pair BL, /BL of the group designated by column address signal Y=n, there is a need to invert (f) data signals DQ0, DQ2 that are input/output via the second and fourth (CA9=1) bit line pairs BL, /BL of the group designated by column address signal Y=n, and (g) data signal DQ2 that is input/output via the third (CA9=0) bit line pair BL, /BL of the group designated by column address signal Y-n.

Furthermore, when cell MC of interest is the memory cell MC corresponding to data signal DQ2 that is input/output via the fourth (CA9=1) bit line pair BL, /BL of the group designated by column address signal Y=n, there is a need to invert (h) data signal DQ2 that is input/output via the third (CA9=0) bit line pair BL, /BL of the group designated by column address signal Y=n, (i) data signal DQ2 that is input/output via the fourth (CA9=1) bit line pair BL, /BL of the group designated by column address signal Y=n, and (j) data signal DQ0 that is input/output via the first (CA9=0) bit line pair BL, /BL of the group designated by column address signal Y=n+1.

In the x8 configuration, the two data signals that are input/output simultaneously are DQ0 and DQ2, and there are four patterns of operation of data inverting circuit 30, namely, (k) the case where data signal DQ0 alone is inverted, (l) the case where data signal DQ2 alone is inverted, (m) the case where both data signals DQ0, DQ2 are inverted, and (n) the case where neither of data signals DQ0, DQ2 is inverted. Thus, unique column address signals CA11, CA12 are respectively assigned to the cases of k) to (n). For the cases of (a) to (n), for instance, CA12, CA11=01, 10, 11, 00, respectively. When test signal TE1 attains the active level or the "H" level and when word configuration activating signal φEx8 attains the active level or the "H" level, decoder 31 causes a signal DQI corresponding to a data signal DQ to be inverted to attain the active level or the "H" level according to signals CA11, CA12. For instance, when CA11, CA12=01 is input, decoder 31 causes signal DQI2 corresponding to data signal DQ2 to be inverted to attain the active level or the "H" level, and causes signals DQI0, DQI1, DQI3 corresponding to other data signals DQ0, DQ1, DQ3 to attain the inactive level or the "L" level. Accordingly, data inverting circuit 30 inverts data signal DQ2 as well as allows data signals DQ0 DQI1, DQI3 to pass through.

Moreover, in the x4 configuration, decoder 31 is rendered inactive, and signals DQI0 to DQI3 all attain the "L" level, and data inverting circuit 30 allows data signals DQ0 to DQ3 to pass through without inversion. In the x4 configuration, the data signal that is input simultaneously is DQ0 alone so that only the logic level of the external address signal D0 itself needs to be switched according to a column address signal. There is no need to invert only one data signal among a plurality of data signals DQ0, DQ2 (or DQ0 to DQ3) that are input simultaneously as in the x8configuration (or the x16 configuration).

FIG. 11 is a block diagram showing the relations among a column address signal Y (CA0 to CA8), CA9, CA11, data signal DQ0, and bit line pairs BL, /BL in the x4 configuration. As shown in FIG. 11, a plurality of bit line pairs BL, /BL of memory block MB are divided into groups of four bit line pairs in advance. FIG. 11 shows one group to which a unique column address signal Y=n is assigned. Column address signal CA9=0 is assigned to the first and third bit line pairs BL, /BL of each group, and column address signal CA9=1 is assigned to the second and fourth bit line pairs BL, /BL of each group.

In addition, column address signal CA11=0 is assigned to the first and second bit line pairs BL, /BL of each group, and column address signal CA11=1 is assigned to the third and fourth bit line pairs BL, /BL of each group. Therefore, one bit line pair BL, /BL is specified by column address signal Y (CA0 to CA8), CA9, CA11. Inputting/outputting of data signal DQ0 is performed using the specified one bit line pair BL, /BL.

Now, the operations of data inverting circuit 30 and decoder 31 shown in FIGS. 5 to 11 will be described. FIGS. 12A to 12E are timing charts showing an operation of the SDRAM during a write cycle in a test mode. It is assumed, however, that the SDRAM is set to the x16 configuration and that a cell MC of interest is a memory cell MC corresponding to data signal DQ1 that is input/output using the second bit line pair BL, /BL of the group designated by column address signal Y=n.

Referring to FIGS. 12A to 12E, a write command, column address signals CA9 to CA12=0101, column address signal Y=n, and data signals D0 to D3 having the "H" level are input in synchronization with a rising edge of a clock signal CLK. Column address signals CA9 to CA12=0101 are input to decoder 31 and decoder 31 turns signals DQI0 to DQI3 into 1110. Data signals D0 to D3 are input to data inverting circuit 30 via 10 buffer 14 and data buses DB0a to DB3a. Data signals D0 to D2 are inverted by data inverting circuit 30, while data signal D3 is not. Output data signals /D0, /D1, /D2, D3 from data inverting circuit 30 are written into four memory cells MC via read/write circuit 12 and global IO line pairs GIOP0 to GIOP3.

When writing data signals D0 to D3 to a group other than the bit line pair group corresponding to cell MC of interest, column address signals CA9 to CA12 are set to 1111, and data signals D0 to D3 are not inverted.

FIGS. 13A to 13E are timing charts showing an operation of the SDRAM during a read cycle in a test mode. Referring to FIGS. 13A to 13E, a read command, column address signals CA9 to CA12=0101, and column address signal Y=n are input in synchronization with a rising edge of clock signal CLK. Column address signals CA9 to CA12=0101 are input to decoder 31 and decoder 32 turns signals DQI0 to DQI3 into 1110. Read data signals /Q0, /Q1, /Q2, Q3 are input to data inverting circuit 30 via read/write circuit 10 and data buses DB0b to DB3b. Data signals /Q0 to /Q2 are inverted by data inverting circuit 30, while data signal Q3 is not. Output data signals /Q0 to Q3 from data inverting circuit 30 are output to a tester via data buses DB0a to DB3a and 10 buffer 14. The tester determines that cell MC of interest is normal when read data signal Q1 is at the same level of "H" level as write data signal D1, and otherwise determines that cell MC of interest is defective.

According to the first embodiment, each data signal D is written into a memory cell MC either inverted or uninverted based on upper bit signals (CA9 to CA12 in the x16 configuration, CA11 and CA12 in the x8 configuration) of column address signals CA0 to CA12 during the write operation so that a test pattern can be easily written into a memory block MB without using a complicated pattern program.

Moreover, as in the write operation, each data signal Q is output either inverted or uninverted during the read operation so that a memory cell MC which is the target of the test can be determined to be normal or defective by determining whether the logic of write data signal D matches the logic of read data signal Q.

Furthermore, although data signals DQ are not inverted in the x4 configuration in the first embodiment, the present invention is not so limited. For instance, each data signal D may be written, either inverted or uninverted according to column address signal CA12, into a memory cell MC, and each data signal Q may be output, inverted or uninverted.

Second Embodiment

Figure 14:
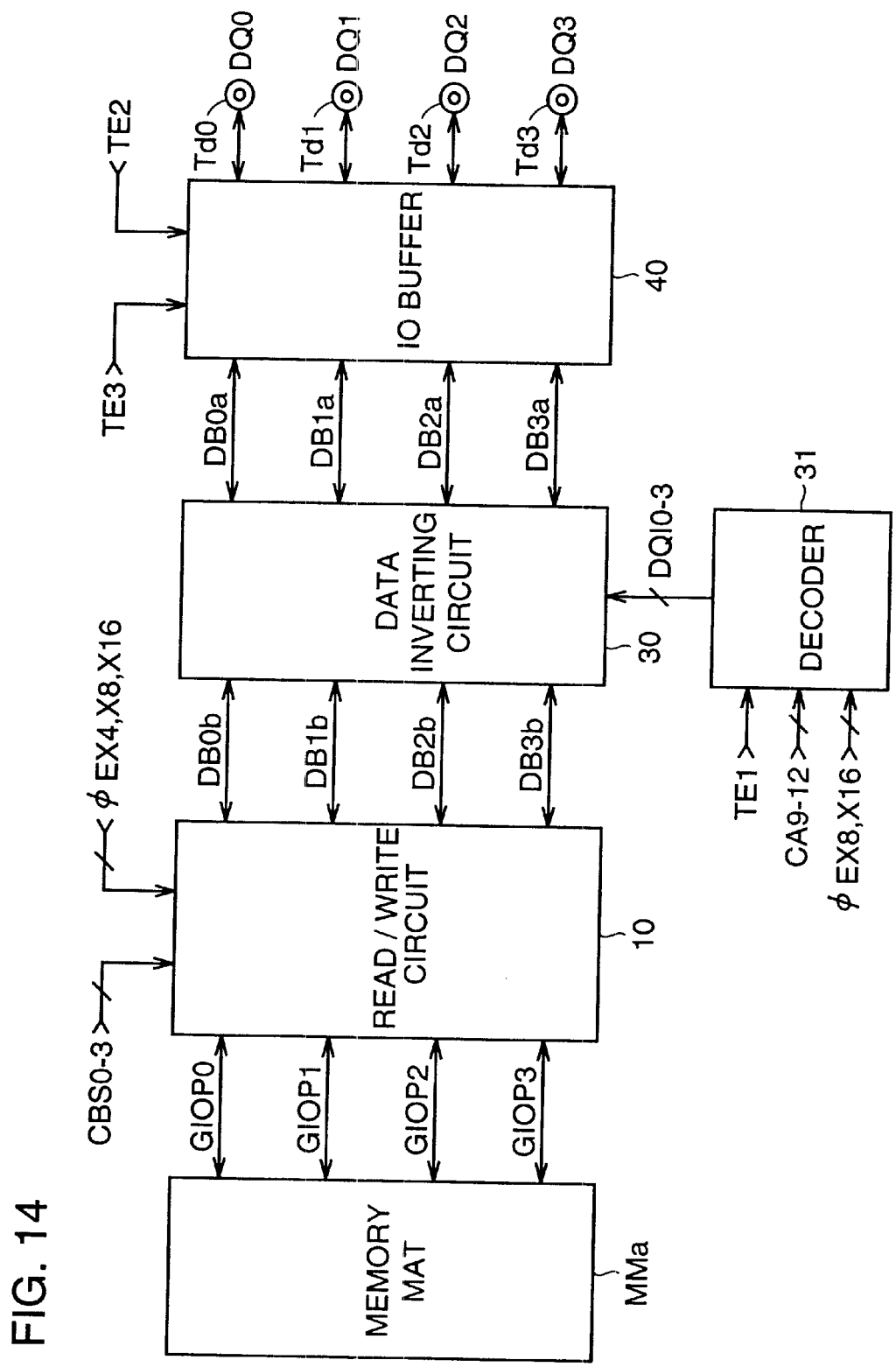
FIG. 14 is a block diagram representing a main portion of an SDRAM according to a second embodiment of the present invention.

FIG. 14 is a block diagram representing a main portion of an SDRAM according to the second embodiment of the present invention, and is presented in contrast to FIG. 5. Referring to FIG. 14, the SDRAM of the second embodiment differs from the SDRAM of the first embodiment in that IO buffer 14 is replaced by an IO buffer 40.

Figure 15:
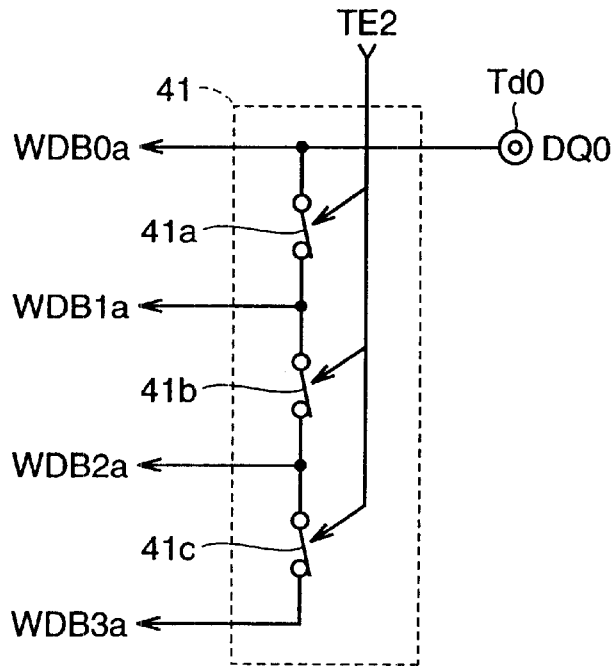
FIG. 15 is a circuit diagram representing an arrangement of a switching circuit included in an IO buffer shown in FIG. 14.

IO buffer 40 includes a switching circuit 41 shown in FIG. 15. Switching circuit 41 includes switching elements 41a to 41c respectively connected between write data buses WDB0a and WDB1a, write data buses WDB1a and WDB2a, and write data buses WDB2a and WDB3a. Switching elements 41a to 41c are rendered conductive when a test signal TE2 is at the active level or the "H" level.

During a test, only the data input/output terminal Td0 for data signal DQ0 among data input/output terminals Td0 to Td3 for data signals DQ0 to DQ3 is connected to a tester. During the write operation in the test, test signal TE2 attains the active level or the "H" level so that switching elements 41a to 41c are rendered conductive, and four write data buses WDB0a to WDB3a are coupled together. A data signal DT supplied to data input/output terminal Td0 is supplied to four write data buses WDB0a to WDB3a via switching circuit 41.

At this time, the data signal of a desired data bus of the four write data buses WDB0a to WDB3a can be inverted by causing signals TE1 and φEx16 to attain the active level or the "H" level and by supplying the desired column address signals CA9 to CA12, and a data signal of a desired logic level can be written into each of four memory cells MC.

Figure 16:
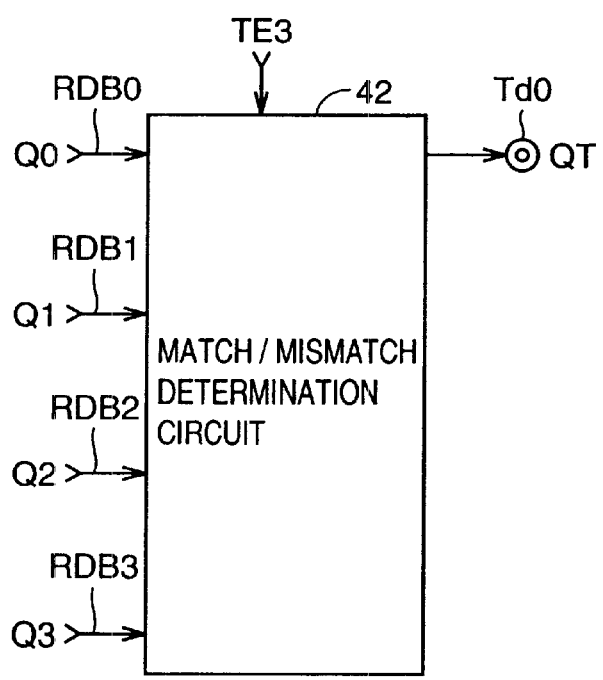
FIG. 16 is a block diagram representing a match/mismatch determination circuit included in the IO buffer shown in FIG. 14.
Figure 17:
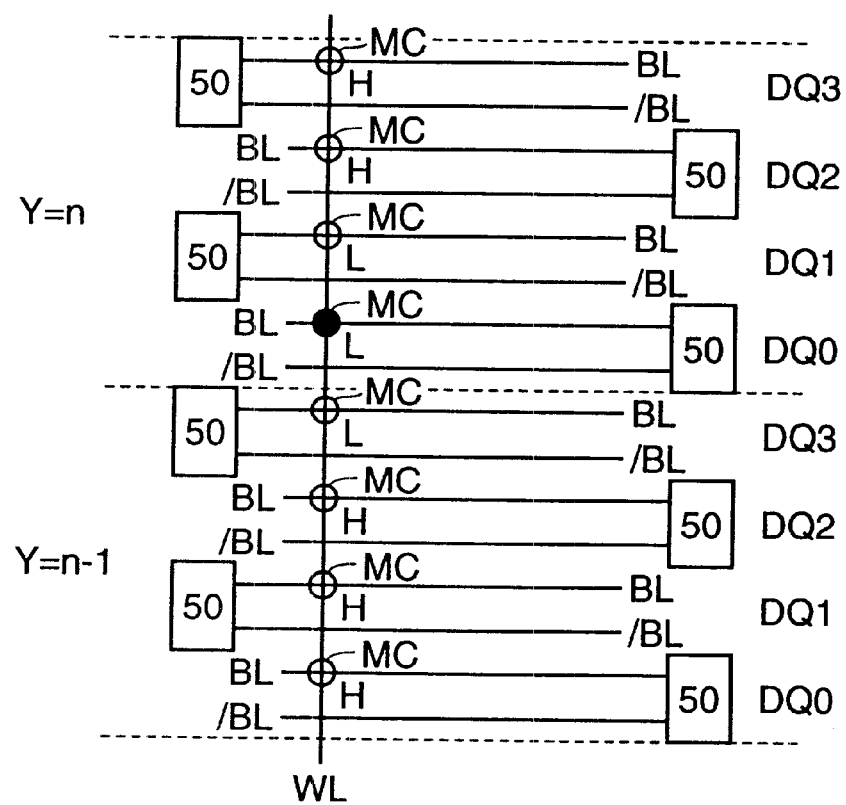
FIG. 17 is a diagram showing the relations among a column address signal, a data signal, and a bit line pair in a x16 configuration of a conventional SDRAM.

In addition, IO buffer 40 contains a match/mismatch determination circuit 42 shown in FIG. 16. Match/mismatch determination circuit 42 is rendered active when a test signal TE3 is at the active level or the "H" level, determines whether the logic of read data signals Q0 to Q3 supplied via four read data buses RDB0a to RDB3a match, causes a signal QT to attain the "L" level when they match, and causes signal QT to attain the "H" level when they do not match.

During the read operation in the test, four data signals are read from the four memory cells MC into which data signals were written during the write operation, and are supplied to data inverting circuit 30.

At this time, the data signal that was inverted during the write operation can be inverted back by data inverting circuit 30 by causing signals TE1 and φEx16 to attain the active level or the "H" level and by supplying to decoder 31 the same column address signals CA9 to CA12 supplied to decoder 31 during the write operation, Moreover, by causing test signal TE3 to attain the active level or the "H" level, match/mismatch determination circuit 42 determines whether the logic of data signals Q0 to Q3 output to data buses RDB0a to RDB3a from data inverting circuit 30 match, and signal QT having a level according to the result of determination is supplied to the tester via data input/output terminal Td0. The four memory cells MC are determined to be normal when the logic of data signals Q0 to Q3 match and signal QT attains the "L" level. If the logic of data signals Q0 to Q3 do not match and signal QT attains the "H" level, at least one memory cell MC of the four memory cells MC is determined to be defective.

According to the second embodiment, one data input/output terminal Td0 alone of four data input/output terminals Td0 to Td3 can be connected to the tester, and four memory cells MC can be simultaneously tested to determine whether they are normal or defective. Thus, in comparison to the case in which four data input/output terminals Td0 to Td3 are connected to the tester in order to test whether the four memory cells MC are normal or defective, four times as many SDRAMs can be tested per unit time, and reduction in the test cost can be achieved.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:
   a memory array including a plurality of memory cells arranged in multiple rows and columns, a plurality of word lines respectively provided corresponding to said multiple rows, and a plurality of bit line pairs respectively provided corresponding to said multiple columns;

a row select circuit for selecting one of said plurality of word lines according to a row address signal and for activating each memory cell corresponding to the selected word line;

a column select circuit for selecting N bit line pairs (N being an integer at least 1) of said plurality of bit line pairs according to a column address signal;

a write data inverting circuit for receiving externally supplied N data signals and for outputting each data signal inverted or uninverted based on a data control signal;

a write circuit for writing N data signals output from said write data inverting circuit into N memory cells that are rendered active by said row select circuit via N bit line pairs selected by said column select circuit; and a plurality of address signal input terminals for inputting said row address signal and said column address signal at different timing, wherein said data control signal is input along with said column address signal using an address signal input terminal among said plurality of address signal input terminals which is not used for inputting of said column address signal.

2. The semiconductor memory device according to claim 1, further comprising:

a read circuit for reading data signals of N memory cells rendered active by said row select circuit via N bit line pairs selected by said column select circuit;

a read data inverting circuit for receiving N data signals read by said read circuit and for outputting each data signal inverted or uninverted based on said data control signal; and N data input/output terminals for outputting to outside N data signals output from said read data inverting circuit and for supplying N data signals to said write data inverting circuit from outside.

3. The semiconductor memory device according to claim 2, wherein a number N of bit line pairs selected by said column select circuit can be changed, and each of said write data inverting circuit and said read data inverting circuit outputs each data signal inverted or uninverted based on said data control signal and a word configuration instruction signal indicating the number N of bit line pairs selected by said column select circuit.

4. The semiconductor memory device according to claim 3, further comprising:

a decoder for causing each of N inversion instruction signals corresponding to N data signals to attain an active level or inactive level based on said word configuration instruction signal and said data control signal, wherein said write data inverting circuit includes N first inverting circuits which are respectively provided corresponding to externally supplied N data signals and each of which inverts a corresponding data signal when a corresponding inversion instruction signal is at an active level and allows the corresponding data signal to pass through without inversion when the corresponding inversion instruction signal is at an inactive level, and said read data inverting circuit includes N second inverting circuits which are respectively provided corresponding to N data signals read by said read circuit and each of which inverts a corresponding data signal when a corresponding inversion instruction signal is at an active level and allows the corresponding data signal to pass through without inversion when the corresponding inversion instruction signal is at an inactive level.

5. The semiconductor memory device according to claim 4 further comprising:

a switching circuit for supplying to each of said N first inverting circuits a data signal externally supplied via a predetermined data input/output terminal of said N data input/output terminals during a test mode, and a match/mismatch determination circuit for determining whether logic of N data signals output from said N second inverting circuits match and for supplying a signal of a level corresponding to a result of determination to said predetermined data input/output terminal during said test mode.

* * * * *